United States Patent [19]
Runyan

[11] Patent Number: 5,250,845
[45] Date of Patent: Oct. 5, 1993

[54] TOTALLY ENCLOSED HERMETIC ELECTRONIC MODULE

[75] Inventor: Michael D. Runyan, Torrance, Calif.

[73] Assignee: Hughes Aircraft Company, Los Angeles, Calif.

[21] Appl. No.: 621,182

[22] Filed: Nov. 30, 1990

[51] Int. Cl.⁵ .................. H01L 23/02; H01L 23/12
[52] U.S. Cl. .................. 257/729; 257/699; 257/710; 257/712; 174/52.1; 361/715; 361/730
[58] Field of Search .................. 357/74, 80, 81; 361/386, 389, 390, 394; 174/52.1, 52.4; 257/699, 710, 712, 729

[56] References Cited

U.S. PATENT DOCUMENTS

| | | | |
|---|---|---|---|
| 3,777,220 | 12/1973 | Tatusko et al. | 361/386 |
| 4,009,752 | 3/1977 | Wilson | 361/386 |
| 4,372,037 | 2/1983 | Scapple et al. | 361/400 |
| 4,577,056 | 3/1986 | Butt | 174/52.4 |
| 4,963,414 | 10/1990 | LeVasseur et al. | 174/250 |

*Primary Examiner*—Rolf Hille
*Assistant Examiner*—David Ostrowski
*Attorney, Agent, or Firm*—L. A. Alkov; W. K. Denson-Low

[57] ABSTRACT

The hermetic module (10) has a frame 12 with an integral heat sink panel (20) extending thereacross between the side walls (14, 16). High-density integrated circuit electronics are mounted on the heat sink panel by hybrid assembly techniques. Covers (36, 38) are welded to the walls to achieve closure. Feedthrough 74 includes connector block (84) extending through an opening in front bulkhead (76). The front bulkhead is Kovar clad, and seal is achieved by means of a Kovar flexible seal extending between the Kovar side of the front bulkhead and the Kovar ring on the connector block.

21 Claims, 2 Drawing Sheets

TOTALLY ENCLOSED HERMETIC ELECTRONIC MODULE

FIELD OF THE INVENTION

This invention is directed to a package for the enclosure, protection and interconnection of a plurality of electronic chips in a hermetic environment, including a two-sided heat sink panel with one or more high density interconnection boards on each side thereof, each board carrying a plurality of integrated circuit chips directly mounted thereon and wired thereto. The structure allows high density packaging in an E-size standard electronics module.

BACKGROUND OF THE INVENTION

In conventional digital electronics packaging, each integrated circuit chip is enclosed in its own hermetic package, which is then mounted on a printed wiring board by soldering. One kind of module employs approximately one hundred of these single chip packages soldered to printed wiring boards bonded on both sides of an aluminum heatsink. Instead of individually packaged integrated circuits, a current packaging method is to enclose approximately forty integrated circuits on an interconnect substrate within a single hermetic package to form a hybrid. Four of these large hybrids are then soldered to the printed wiring board modules in the same way as the conventional single chip hermetic packages. The interconnect substrates within the hybrid provide chip-to-chip connections on 0.004 inch centers instead of the 0.025 inch centers on the printed wiring board.

While printed wiring boards could be used, conventional printed wiring boards generally do not have the required density to connect silicon die that have I/O pads on 0.004 inch centers. A preferred method is generally referred to as "high density multichip interconnect." Other methods could be used and, in fact, an advantage of the hermetic module is that different interconnect methods could be used within the same module to maximize cost vs. density required.

Large hermetic packages have been used in microwave applications. The packages are usually made of Kovar to match the temperature coefficient of glass feedthroughs. Kovar is very heavy, expensive, difficult to machine, and has poor heat transfer. Aluminum is a better material, but its large temperature coefficient of expansion presents a problem when ceramic or glass insulators are used to provide Input/Output connections. Such may be useful for microwave applications, but digital electronic signal systems require a very much larger number of Input/Output connections. In the E-size standard electronic module, the number of Input/Output connections does not allow the use of individual glass beads. The number of Input/Output connections required is not feasible in this package size.

SUMMARY OF THE INVENTION

In order to aid in the understanding of this invention, it can be stated in essentially summary form that it is directed to a hermetic modular package which includes an aluminum frame having a transverse heat sink. Walls rise above the heat sink on both sides to form component pockets and carry hermetic closure lids. One end of the frame has a ceramic feedthrough which permits exterior connection and interiorly connects to printed wiring boards on the heat sink.

It is thus a purpose and advantage of this invention to provide a hermetic modular package which permits greater electronic density within an E-size standard electronic module.

It is another purpose and advantage of this invention to provide a hermetic modular package which is light because it eliminates chip packaging and permits the use of light metal to, thus, achieve more integrated circuit chips within the package.

It is another purpose and advantage of this invention to provide lower component junction temperatures and associated increase in reliability by employing high thermal conductivity metal and elimination of the hermetic packaging of individual integrated circuit chips.

It is another purpose and advantage of this invention to provide a hermetic modular package which allows the employment of thick metal in the frame and in the lids for increased ruggedness and greater nuclear, biological, chemical and electromagnetic interference protection.

It is another purpose and advantage of this invention to employ a package which provides for a high-density, high reliability, producible hermetic feed-through through aluminum package walls, without the use of solder or other creep susceptible materials.

It is another purpose and advantage of this invention to provide a hermetic feedthrough which permits employment of controlled impedance and shielded conductors.

It is another purpose and advantage of this invention to employ a solderless crossover from one side of the module to the other that can be controlled impedance and provide connections on 0.004 inch centers.

It is a further purpose and advantage of this invention to provide a feedthrough from the modular package which is of such configuration that stresses due to mismatch of the temperature coefficient expansion are concentrated in a large, reliable aluminum-Kovar diffusion weld so as to retain integrity over temperature differentials.

Other purposes and advantages of this invention will become apparent from a study of the following portion of this specification, the claims and the attached drawings wherein:

DESCRIPTION OF THE PREFERRED EMBODIMENT

Figure 1:
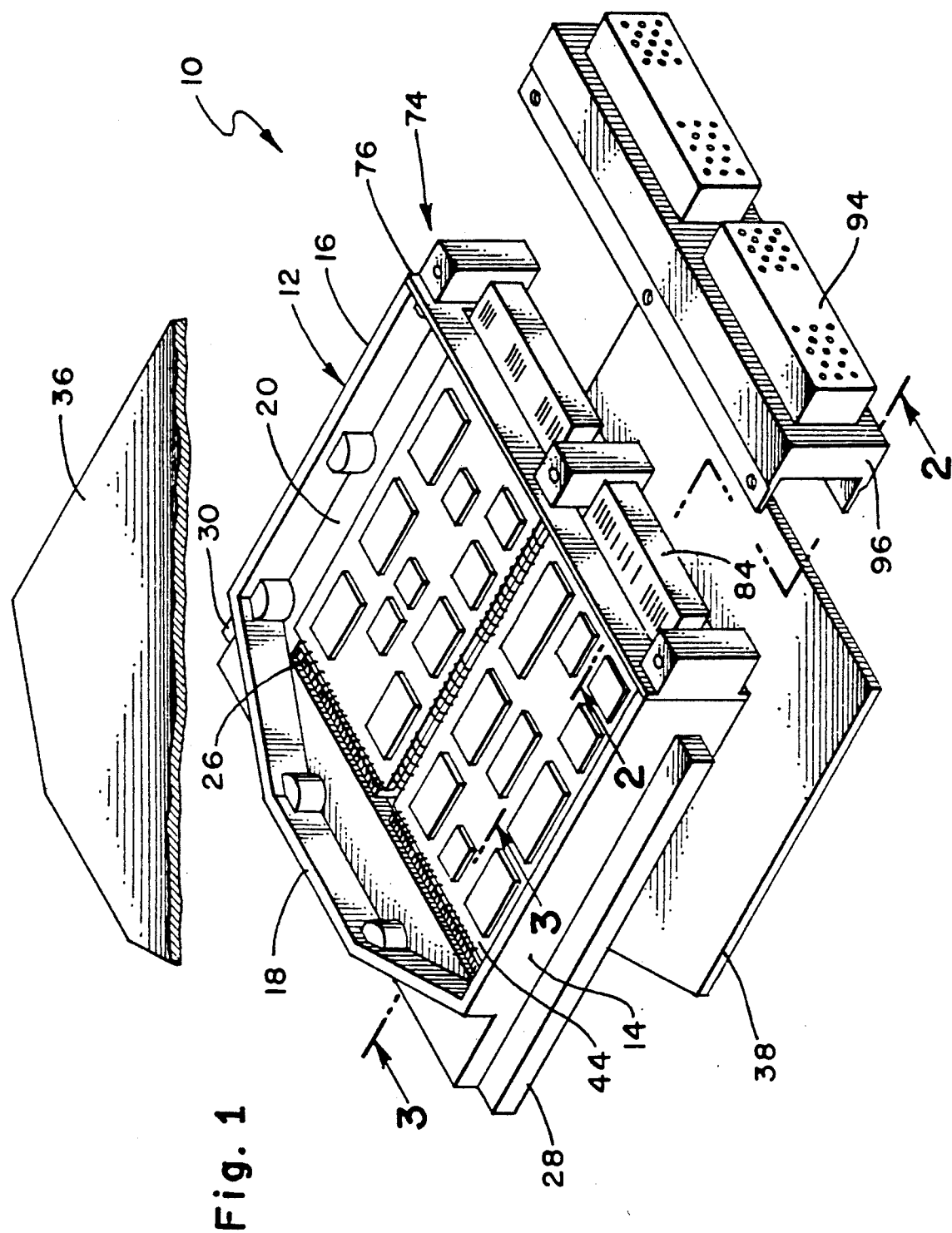
FIG. 1 is an exploded isometric view of the hermetic module package of this invention.
Figure 2:
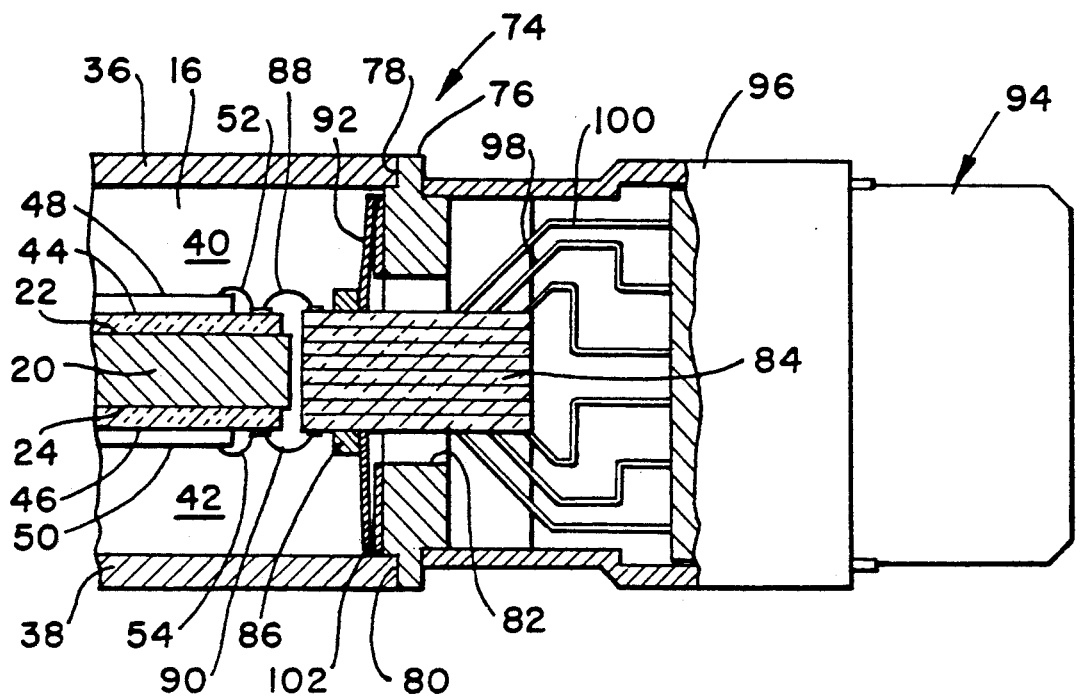
FIG. 2 is an enlarged section taken generally along 2—2 FIG. 1.
Figure 3:
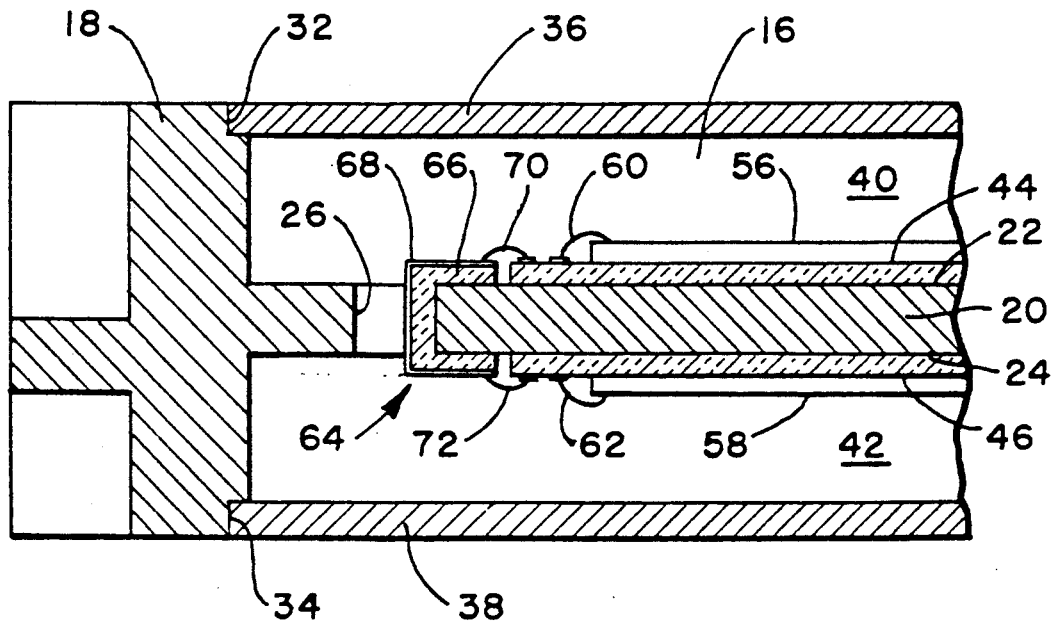
FIG. 3 is an enlarged section taken generally along 3—3 of FIG. 1.

The hermetic module of this invention is shown at 10 in FIG. 1 as an exploded view. The principal part of the package structure 10 is frame 12. The frame 12 comprises left and right walls 14 and 16, as viewed from the connector end at the lower right in FIG. 1. It also has rear wall 18. Between the walls and attached to the left and right walls 14 and 16 is heat sink 20. Heat sink 20 is a flat panel 20 having a top surface 22 and a bottom surface 24, see FIGS. 2 and 3. The center panel which forms the heat sink 20 is interrupted with slot 26 before it reaches the rear wall 18. The structure of the frame thus described can be machined out of a single aluminum sheet so that the heat sink is intimately thermally connected with the left and right walls and the heat sink is supported within the frame so that it can carry electronic structures thereon. Exteriorly, the walls may carry ribs 28 and 30 thereon for the support of the package 10 and for thermal connection thereto. The walls preferably have recesses therein, such as recesses 32 and 34 in wall 18, as seen in FIG. 3, so that top and bottom covers 36 and 38 may be inserted therein and sealed therein. The frame and the covers are preferably aluminum so that hermetic sealing of the covers onto the frame can be conveniently achieved. This frame structure with its heat sink and covers defines upper and lower component pockets 40 and 42. These pockets are joined by slot 26.

High density interconnect substrates 44 and 46 are respectively mounted on the top and bottom surfaces of heat sink 20. These high density interconnect substrates carry circuit pads on the top surface thereof. Since they are used in a hermetic environment, gold bonding can be employed. Integrated circuit chips 48 and 50, as seen in FIG. 2, can be attached to the high density interconnect substrates 44 and 46, respectively, and connected by means of gold wire bonds 52 and 54 to pads on the high density interconnect substrates. Since the connections are in a hermetic environment, attachments are wire-bonded instead of soldered. This allows distance between the bond leads to be as low as 0.004 inch instead of the distance five times as great required for solder connections. At the left end, integrated circuit chips 56 and 58 are mounted on the high density interconnect substrates 44 and 46 and are connected to pads on these substrates by means of wire bonds 60 and 62. The interconnect substrate may be one, two or more pieces with the capability of intermixing substrate technology, as pointed out in the background. As seen in FIG. 1, should it be more convenient for other manufacturing processes, two substrates can be used in left-to-right position on the top of the heat sink. Similarly, on the lower surface of the heat sink, two such boards may be also mounted side by side. Connection between the two high density interconnect substrates can be accomplished by gold wire bonding at adjacent edges thereof.

In order to permit connection between the traces on the high density interconnect substrates above and below the heat sink, connector 64 is provided in slot 26. Connector 64 has a dielectric U-shaped body 66 upon which is formed, as by printing, parallel traces which extend from top to bottom. Trace 68 is shown. The dielectric body is preferably resilient, but may be rigid as a U-shaped ceramic channel with conductors extending around the three surfaces. The traces on the connector are connected to the circuitry by wire bonds 70 and 72 which provide electrical connection between the upper and lower high density interconnect substrates through the connector 64. Slot 26 is long and, with wire bonds 70 and 72 being as close as 0.004 inch apart, many interconnections are possible.

It is, thus, shown that a high-density integrated circuit chip system can be incorporated into an E-size electronic module, complete with provisions for adequate heat removal. A suitable hermetic feedthrough assembly is necessary to make the package useful. Such an assembly is generally indicated at 74 in FIG. 1 and is shown in more detail in FIG. 2. Front bulkhead 76 closes the open side of the otherwise closed package. Bulkhead 76 is a bimetallic structure wit a Kovar (a low expansivity alloy such as 29 Ni-17Co-Fe) layer on the left side and aluminum on the right side, as seen in FIG. 2. The Kovar layer is thinner than the aluminum layer. Recesses 78 and 80 are milled around the periphery of the bulkhead to receive the covers 36 and 38, respectively. Similar recesses are milled to receive the ends of the walls 14 and 16. These recesses are deep enough to cut through the Kovar surface layer so that attachment of the walls and covers can be accomplished as an aluminum-aluminum juncture.

To permit passage of electrical conductors through the front bulkhead, it has an opening 82 therethrough. Connector block 84 lies within the opening. Connector block 84 is a multi-layer ceramic structure with conductor pads running from left to right between the layers. The outer surfaces of the connector block do not have conductors thereon through the center of the block in the left-to-right direction, but the conductors extend through the inbetween layers from left to right. Kovar ring 86 extends around the connector block and is brazed thereto. Since there are no conductors on the outer surfaces at the position of this right, it does not cause short circuits. To the left of the Kovar ring and to its right, the top and bottom surfaces of the connector block carry exterior connector pads which are connected to the interior conductors and which are subject to connection.

On the left end, the pads are close together and can be connected by wire bonding, such as wire bonds 88 and 90, similar to the wire bonds 52 and 54. Gold wire ball bonding is one useful attachment method. On the right end, since it is exterior to the hermetic space, solder pads may be placed on the upper and lower surfaces of the connector block. In order to close the opening 82, Kovar flexible seal 92 is provided. The Kovar flexible seal 92 is a thin, flat plate with a slot through which the connector block 84 passes. The Kovar ring 86 may be machined as part of this plate or brazed to it. The periphery of the slot of flexible seal 92 is copper-silver brazed with the aid of Kovar ring 86 to the connector block 84. The outer edge of flexible seal 92 is parallel gap seam 203 welded to the Kovar layer on bulkhead 76. In this way, a Kovar-to-Kovar seal is achieved at both ends of the flexible seal. The Kovar-to-aluminum interface in bulkhead 76 is a diffusion weld. The configuration provides a large interface area for the Kovar-to-aluminum weld.

The thickness of the Kovar layer and the aluminum layer is chosen to achieve an optimum stress distribution. The design is preferably configured so that all of the stress due to differences in temperature coefficient of expansion are in this large area diffusion welded interface. The covers 36 and 38 are of aluminum so that laser welding of the aluminum covers onto the walls and bulkhead provides for reliable seal. In this way, hermetically sealed component pockets are achieved, together with a large number of Input/Output connections. A conventional hermeticity check and evacuation tube is attached to the module. The tube is sealed after hermetic sealing is assured.

As seen in FIG. 1, there are two connector blocks, with the near one identified as being block 84. The far block is identical. Two such blocks are required where a large number of Input/Output connections is desired. Where feasible, only one such block can be used.

Connector body 94 is the body of a standard connector, such as a Bendix conductor. The standard Bendix connector is used as an example, and other convenient means can be used to attach to the hermetic modular package. The connector body 94 can, thus, be other types of standard or special connectors. A female connector body is shown. Housing 96 is specially configured to secure to the recess on the front bulkhead and to receive the connector body 94. The middle and ends of housing 96 have holes that are used to clamp the top and bottom housing halves around the plastic connector body 94 and onto the three tabs on bulkhead 76. The connector body has a plurality of leads therefrom, with two of the leads identified at 98 and 100. There is a lead corresponding to each connection point in connector body 94. The leads extending out of the plastic connector body are soldered to the pads before the top and bottom housing halves are assembled. The leads from the connector body are attached to the circuitry through solder pads on the right end of the connector block 84. A larger area of the connector block is exposed outside of the seal ring 86 in order to permit the use of solder pads, which are larger than gold wire bonding pads. The connector block 84 thus provides an economical, reliable, high-density, hermetic Input/Output connection block for the module with adequate area for gold wire bonding on the inside of the module and solder connected leads on the outside.

Upon completion, the covers are laser-welded to form the hermetic enclosure. Details are machined on the outside walls for module extractors, module clamps, and thermal connection. The Kovar-ceramic joint can be reliably brazed because Kovar has a high melting point and a temperature coefficient expansion close enough to that of the ceramic connector block. The two Kovar-to-Kovar seams are welded together using a conventional parallel gap seam welder. The seam welding does not significantly elevate the part temperature and, therefore, can be used to produce a relatively stress-free assembly. Nickel plating of the exterior Kovar surface is required for corrosion protection. The connector block 84 has power, ground and signal layers sandwiched inside. The ceramic block can be metallized around the perimeter at ring 86 for attachment of the Kovar ring. The Kovar flex seal 92 may be of other configuration to further relieve stresses. Domed or accordion-folded sheets can be employed for the flexible seal, but a simple seal of the type illustrated is sufficient. In this way, a complete E-size standard electronics module is hermetically sealed. Such sealing permits the module electronics to be packaged using conventional high-density hybrid assembly techniques over the large usable substrate area. Much higher electronic density is then achieved.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A hermetic module comprising:
a heat sink panel, two parallel-facing walls and a rear wall perpendicularly disposed to said parallel-facing walls attached to said heat sink panel, a front bulkhead attached to said parallel-facing walls, said walls and said front bulkhead extending above said heat sink panel to define a component pocket above said heat sink panel and between said walls and to carry hermetic closure lids;

high density interconnect substrates carrying circuit pads on top surface thereof for wire bonding, wherein said substrates are mounted on top and bottom surfaces of said heat sinks;

closure means for closing said module below said component pocket and below said heat sink panel;

a cover for sealing against said walls and front bulkhead for closing said component pocket above said heat sink panel; and an opening in said front bulkhead, a ceramic connector block in said opening, conductor pads on the inner surfaces in said connector block and conductor pads on top and bottom surfaces of the exterior of said connector block for connection between the interior and exterior of said package, a low expansivity alloy flexible seal attached to said connector block and to said front bulkhead to close said opening through said front bulkhead so that a hermetic modular package is achieved and wherein said front bulkhead is a multi-layer structure of a low expansivity alloy material layer diffusion bonded to an aluminum layer and said low expansivity alloy seal is welded to said low expansivity alloy layer of said front bulkhead.

2. The hermetic module of claim 1 wherein a low expansivity alloy material ring is brazed to said ceramic connector block and said flexible seal is brazed to said ring.

3. The hermetic module of claim 2 wherein said flexible seal is attached to said ring by seam-welding and said flexible seal is attached to said Kovar layer by brazing.

4. The hermetic module of claim 3 wherein said walls and said heat sink panel are integral and said walls and said cover are aluminum and are attached by welding to hermetically seal said component pocket.

5. The hermetic module of claim 4 further including a connector attached to said connector block.

6. A hermetic module comprising:
a heat sink panel, two parallel-facing walls and a rear wall perpendicularly disposed to said parallel-facing walls integrally formed with said heat sink panel, said walls extending above and below said heat sink panel to define upper and lower component pockets, upper and lower covers sealed to said walls to enclose said upper and lower component pockets;

a front bulkhead, said front bulkhead being laminated of layers of low expansivity alloy material and aluminum, said front bulkhead having an opening therethrough, said front bulkhead being attached to said parallel-facing walls and said top and bottom covers;

a ceramic connector block having conductors therethrough, a metallization layer on a portion of the exterior of said connector block, said connector block extending interiorly and into said package and exteriorly from said package from said metallization layer; and a low expansivity alloy material flexible seal attached to said seal on said front bulkhead and to said metallization layer on said ceramic connector block to close said opening through said front bulkhead to achieve hermetic enclosure of said component pockets.

7. The hermetic module of claim 6 wherein said low expansivity alloy material flexible seal is attached to said metallized layer on said ceramic by welding and said flexible seal is attached to said layer of said bulkhead by brazing.

8. The hermetic module of claim 6 wherein said walls and said covers are made of aluminum and said aluminum covers are attached to said aluminum walls and said bulkhead by welding.

9. The hermetic module of claim 6 wherein there is a connector body supported by said module and connected to said connector block to permit connection to electronic in said module.

10. The hermetic module of claim 6 further including an opening through said heat sink panel and electronics in both of said upper and lower component pockets, and further including a connector through said opening to provide electronic connection between said component pockets.

11. The hermetic module of claim 10 wherein a U-shaped dielectric connection body is engaged on said heat sink panel through said opening, said connection body having electrical conductors thereon extending from said upper component pocket to said lower component pocket.

12. The hermetic module of claim 11 wherein said heat sink panel carries on the upper side thereof an upper dielectric carrying printed wiring and hybrid circuitry thereon and the underside of said heat sink panel carries a lower dielectric having printed wiring and hybrid circuitry thereon, said printed wiring on said upper dielectric being connected to traces on said connection body and said conductors on said connection body being connected to printed wiring on said lower dielectric so as to interconnected said printed wiring.

13. The hermetic module of claim 12 said U-shaped dielectric is flexible.

14. The hermetic module of claim 11 wherein said connection body is connected to said electronics and both said upper and lower component pockets by wire bonding.

15. A hermetic modular package comprising:
a frame having parallel-facing side walls and a back wall perpendicularly disposed to said parallel-facing walls, a heat sink integrally formed with said walls and positioned intermediate the edges of said walls so as to define a component pocket above and a component pockets below said heat sink panel, said heat sink and said walls being made of aluminum;
a front bulkhead secured to said parallel-facing walls, said front bulkhead being laminated of a layer of aluminum and a layer of low expansivity alloy material, said bulkhead being attached to said walls to close said component pockets between said walls;
a top aluminum cover secured and sealed to said walls and to said front bulkhead to cover and close said top component pocket and a bottom aluminum cover secured to and sealed to said walls and to said front bulkhead to close and seal said bottom component pocket;
a ceramic connector block having a periphery and having a top surface, a low expansivity alloy material connector ceramic block extending around said periphery thereof, an opening in said bulkhead, said connector block extending through said openings, a flexible material seal attached and sealed to said low expansivity alloy material connector ring on said ceramic connector block and to said layer on said bulkhead so as to close said opening through said bulkhead; and
conductors through said ceramic block and pads on said surface of said ceramic block so that electrical connections can be made to said pads inside and outside said ring to provide electrical connection between the interiors and the exterior of said package.

16. The hermetic module of claim 15 wherein said ceramic connector block is a multi-layer connector block having printed wiring on intermediate layers thereof and being dielectric at the periphery at which said seal ring is attached.

17. The hermetic module of claim 16 wherein said pads interiorly of said package on said connector block are gold pads for wire bonding and said pads on said connector block exteriorly of said seal ring are solder pads.

18. The hermetic module of claim 15 wherein there is a dielectric layer carrying printed wiring on each of said heat sink panel top and bottom surfaces and there are semiconductor chips secured to said dielectric layers and connected to said printed wiring thereon.

19. The hermetic module of claim 17 wherein there is an opening through said heat sink panel intermediate said walls and there is a connection body in said opening, said printed wiring on each of said dielectric layers being connected to conductors on said connection body so that said printed wiring is connected together.

20. The hermetic module of claim 18 wherein said connection body is U-shaped and is engaged over the edge of said heat sink panel at said opening through said heat sink panel.

21. The hermetic module of claim 20 wherein said connection body is connected to said electronics and both said upper and lower component pockets by wire bonding.

* * * * *